United States Patent
Chen et al.

(10) Patent No.: US 8,295,342 B2
(45) Date of Patent: Oct. 23, 2012

(54) METHOD AND SYSTEM FOR EFFICIENT VIDEO COMPRESSION WITH LOW-COMPLEXITY ENCODER

(75) Inventors: Jun Chen, Hamilton (CA); Dake He, Yorktown Heights, NY (US); Ashish Jagmohan, Irvington, NY (US); Ligang Lu, New City, NY (US); Vadim Sheinin, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 1378 days.

(21) Appl. No.: 11/939,882

(22) Filed: Nov. 14, 2007

(65) Prior Publication Data

US 2009/0122868 A1 May 14, 2009

(51) Int. Cl.
*H04N 7/12* (2006.01)

(52) U.S. Cl. ......... 375/240.01; 375/240.02; 375/240.03; 375/240.18; 375/240.22

(58) Field of Classification Search ........................ None
See application file for complete search history.

(56) References Cited

U.S. PATENT DOCUMENTS

| | | | |
|---|---|---|---|
| 4,191,970 | A | 3/1980 | Witsenhausen et al. |
| 5,887,243 | A | 3/1999 | Harvey et al. |
| 7,177,359 | B2 | 2/2007 | Song et al. |
| 7,233,269 | B1 | 6/2007 | Chen et al. |
| 7,242,721 | B2 | 7/2007 | Alard et al. |
| 7,414,549 | B1 * | 8/2008 | Yang et al. ............ 341/50 |

(Continued)

FOREIGN PATENT DOCUMENTS
WO WO2005043882 A2 5/2005

OTHER PUBLICATIONS

J. Jiang, D. He, and A. Jagmohan. Rateless Slepian-wolf coding based on rate adaptive low-density paritch-check codes. Information Theory, 2007. ISIT 2007. IEEE International Symposium on Jun. 29, 2007.*

Artigas, et al., "The Discover Codec: Architecture, Techniques and Evaluation".

(Continued)

*Primary Examiner* — Bob A Phunkulh
*Assistant Examiner* — Jenkey Van
(74) *Attorney, Agent, or Firm* — Scully, Scott, Murphy & Presser, P.C.; Brian Verminski, Esq.

(57) ABSTRACT

Disclosed are a method and system for video compression, wherein the video encoder has low computational complexity and high compression efficiency. The disclosed system comprises a video encoder and a video decoder, wherein the method for encoding includes the steps of converting a source frame into a space-frequency representation; estimating conditional statistics of at least one vector of space-frequency coefficients; estimating encoding rates based on the said conditional statistics; and applying Slepian-Wolf codes with the said computed encoding rates. The preferred method for decoding includes the steps of; generating a side-information vector of frequency coefficients based on previously decoded source data, encoder statistics, and previous reconstructions of the source frequency vector; and performing Slepian-Wolf decoding of at least one source frequency vector based on the generated side-information, the Slepian-Wolf code bits and the encoder statistics.

18 Claims, 6 Drawing Sheets

PREFERRED EMBODIMENT OF THE ENCODER

U.S. PATENT DOCUMENTS

| | | | |
|---|---|---|---|
| 2001/0016080 A1* | 8/2001 | Goyal et al. | 382/251 |
| 2003/0072366 A1* | 4/2003 | Bartolucci et al. | 375/240.04 |
| 2004/0028127 A1 | 2/2004 | Subramaniyan | |
| 2005/0232360 A1 | 10/2005 | Byun, II | |
| 2005/0268200 A1 | 12/2005 | Garudadri et al. | |
| 2006/0193385 A1 | 8/2006 | Yin et al. | |
| 2006/0197686 A1 | 9/2006 | Liu et al. | |
| 2006/0200733 A1 | 9/2006 | Stankovic et al. | |
| 2007/0160144 A1 | 7/2007 | Lu et al. | |
| 2008/0031344 A1* | 2/2008 | Lu et al. | 375/240.19 |
| 2008/0298702 A1* | 12/2008 | Gunupudi et al. | 382/251 |
| 2009/0074084 A1* | 3/2009 | Drezner et al. | 375/240.29 |

OTHER PUBLICATIONS

Artigas, et al., "The Discover Codec: Architecture, Techniques and Evaluation", Picture Coding Symposium, Lisbon, Portugal, 2007.

Aaron, et al., "Wyner-Ziv Video Coding with Hash-Based Motion Compensation at the Reeiver", 2004 International Conference on Image Processing (ICIP); pp. 3097-3100; and.

Majumdar, et al., "Robust Distributed Video Compression based on Multilevel Coset Codes", 2003 IEEE; pp. 845-849.

* cited by examiner

FIG. 1
PRIOR ART
CONVENTIONAL DPCM - BASED VIDEO CODEC

FIG. 2
PRIOR ART
LOW - COMPLEXITY DPCM VIDEO ENCODER WITH FAST MODE SELECTION

FIG. 3
PRIOR ART
LOW - COMPLEXITY DPCM VIDEO ENCODER WITH FAST MOTION ESTIMATION

FIG. 4

PREFERRED EMBODIMENT OF THE ENCODER

FIG. 5
PREFERRED EMBODIMENT OF THE DECODER

FIG. 6

# METHOD AND SYSTEM FOR EFFICIENT VIDEO COMPRESSION WITH LOW-COMPLEXITY ENCODER

GOVERNMENT RIGHTS

This invention was made with Government support under Contract No.: NNS05AA75C awarded by (NASA) National Aeronautics and Space Administration. The Government has certain rights in this invention.

BACKGROUND OF THE INVENTION

1. Technical Field

The present invention relates generally to methods and apparatuses for encoding and decoding video streams in a video compression system. More specifically, the present invention relates to a method and system for a video encoder and decoder, wherein the video encoder has low computational complexity and good compression efficiency, based on the principle of encoding each video frame using Slepian-Wolf information.

2. Background Art

Conventional video compression is based on the principle of differential pulse code modulation (DPCM). Specifically, a typical video signal is comprised of a sequence of images, termed frames, with temporally neighboring frames being highly correlated. Thus, efficient compression can be realized by differentially predicting a given frame with respect to previously encoded, temporally neighboring frames, and by encoding the prediction error. Compression is achieved since the prediction error typically has a much-reduced dynamic range compared to the original frame. Typical video compression is lossy, i.e., the decoded video frame is non-identical to the original video frame. To ensure that the encoding process is reversible (with some loss) at the decoder, a decoder is embedded within the encoder and differential prediction is constrained to be performed with respect to decoded images rather than original images.

Figure 1:
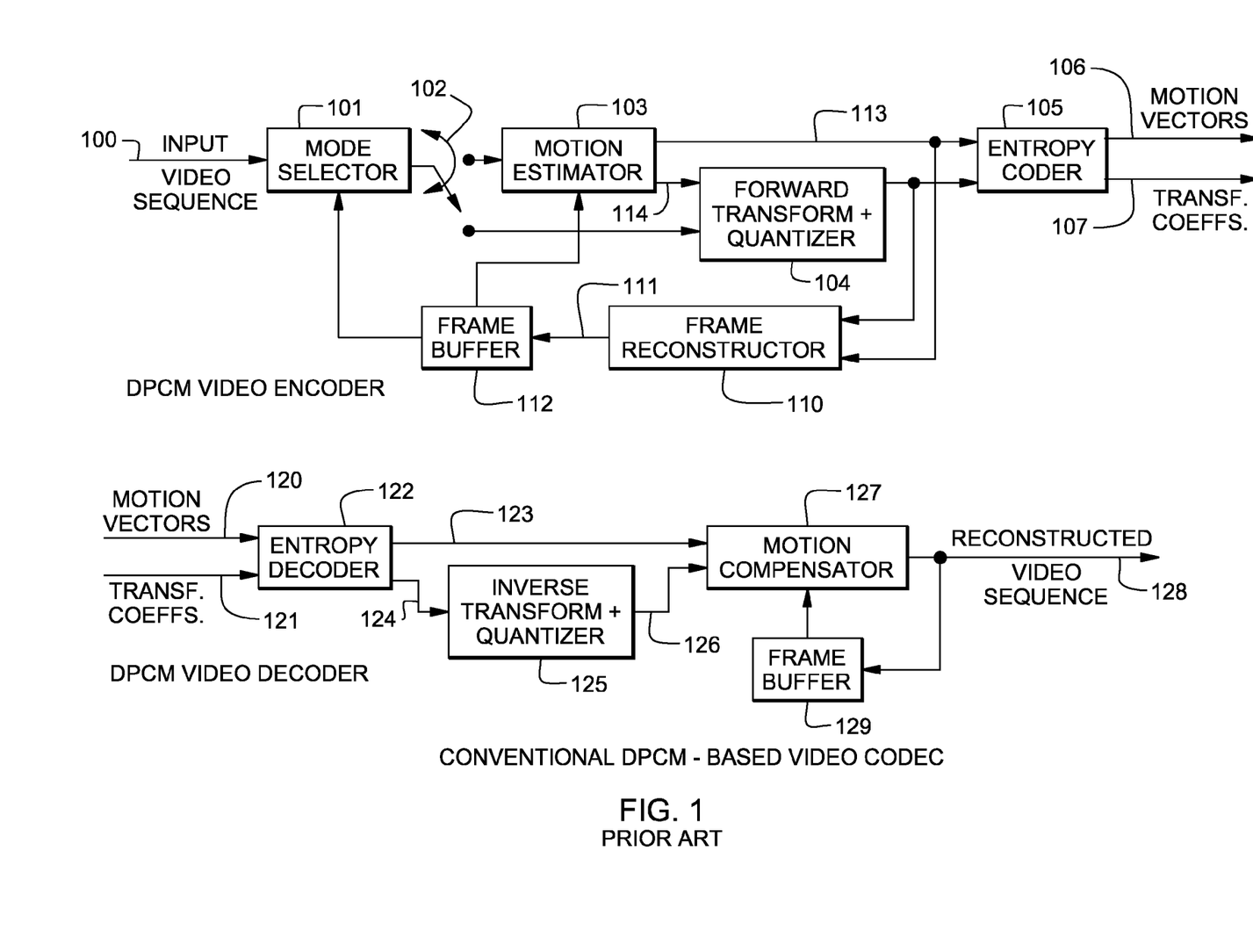
FIG. 1 is a diagram illustrating a prior-art video compression system based on the use of differential prediction at the encoder.

FIG. 1 shows an exemplary conventional video compression system, based on the DPCM principle. The input video sequence 100 is input to a mode selector 101. The mode selector 101 partitions the current video frame into blocks of pixels and selects an encoding mode for each block, which defines the compression method to be used for that block. Examples of encoding modes include independent coding, differentially predicted coding, and skip coding. Given the mode selection for the current block, the selector 101 appropriately selects the compression means to be used for encoding the block. As an example, if the independent coding encoding mode is selected, the current block is input to the forward transform and quantization means 104, which applies a space-frequency transform to the block pixel values, and then discretizes the resulting transform coefficients. If, instead, the differential prediction-coding mode is selected, the current block is input to the motion estimator 103, which estimates the best differential predictor block with respect to previous frames stored in the frame buffer 112. The output of the motion estimator 103 is a set of motion vectors 113, which describes the location of the best differential predictor, as well as a block prediction error 114, which describes the difference between the current block and the differential predictor.

The prediction error 114 is input to the forward transform and quantizer 104, which applies the space-frequency transform to the signal and discretizes the resulting transform coefficients. The discretized transform coefficients and the motion vectors 113 (if present) are input to the entropy coder 105, which applies lossless compression to these. The entropy coder 105 outputs the compressed motion vectors 106 and the compressed transform coefficients 107 for each block. These constitute the compressed representation of the input video sequence 100. The output of the transform and quantizer means 104, and the motion vectors 113 are also input to the frame reconstructor 110, which reconstructs the decoded frame from these. The decoded frame 111 is identical to the output of a video decoder applied to the compressed representation consisting of signals 106 and 107. The decoded frame 111 is stored in the frame buffer 112 to be used for differential prediction of future video frames.

During DPCM video decoding, the compressed representation comprised of signals 120 and 121 is first input to the entropy decoder 122. The outputs of the entropy decoder 122 are the uncompressed motion vectors 123 and the uncompressed discretized transform coefficients 124. The discretized transform coefficients 124 are inverse quantized and converted to the pixel domain by the inverse transform and quantizer means 125. The resulting pixel values 126 represent the original block if the independent coding mode was used to encode the block, and represent the pixel prediction error if the differential prediction mode was used to encode the block. The pixel values 126 are input to the motion compensator 127, which also receives as inputs the motion vectors 123, and previously decoded frames used to generate the differential predictor (if any) from the frame buffer 129. The motion compensator 127 inverts the motion estimation process to generate the reconstructed block. The reconstructed video sequence 128 comprised of reconstructed video frames is the output of the DPCM video decoder. In addition, reconstructed video frames are stored in the frame buffer 129, to be used for motion compensation in future frames.

In the exemplary conventional DPCM video compression system shown in Example 1, the most computationally intensive operations are the motion estimation 103, typically followed by mode selection 101 and entropy coding 105. Further, motion estimation 103 is typically required to be performed for a majority of blocks, since differential prediction generally allows more compression than independent coding. Thus, in conventional video compression the computational complexity of the encoder is much larger than that of the decoder. This traditional paradigm is aimed at applications, such as video broadcasting, where encoding is required to be performed only once while decoding is performed a large number of times. Increasingly, however, video compression systems with computationally simple encoders are in demand in important emerging applications like video surveillance.

Figure 2:
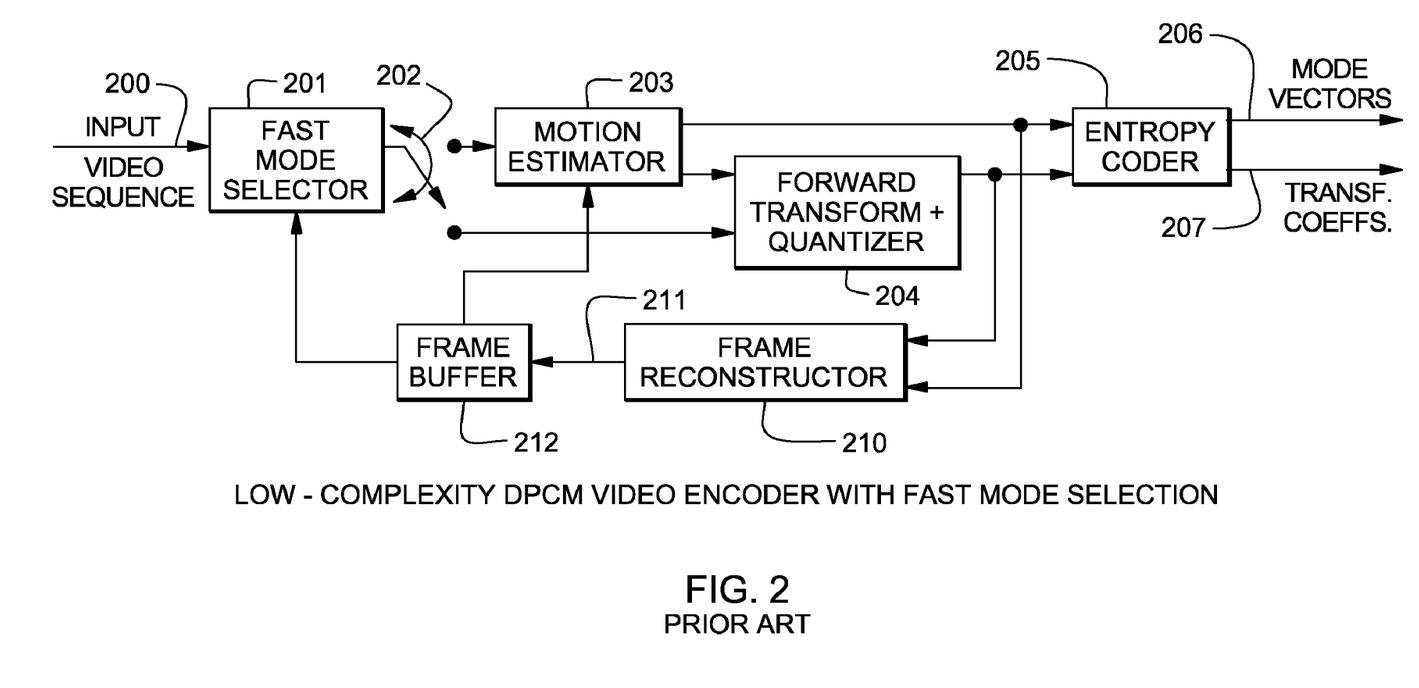
FIG. 2 is a diagram illustrating a prior-art video compression system encoder in which encoding complexity is reduced by employing a fast mode selection method.

Previous methods to facilitate low-complexity video encoding fall in the following categories. The first class of methods employs a low-complexity mode selection process for each block. FIG. 2 shows an exemplary embodiment of this class of methods. A fast mode selector 201, which has low computational complexity, is used to select the encoding mode for each frame block. The remaining modules in the encoder (and decoder) are identical to the modules in FIG. 1. Examples of this class of solutions include the methods described in U.S. Patent Application Publication No. US 2006/0193385 A1 for "Fast mode-decision encoding for interframes", and U.S. Patent Application Publication No. US 2004/0028127 A1 for "Method and apparatus for reducing computational complexity in video encoders". The main shortcoming of these approaches is that reducing the complexity of mode selection alone does not typically reduce the complexity of video encoding significantly. This is because, as mentioned above, motion estimation has significant computational complexity.

Figure 3:
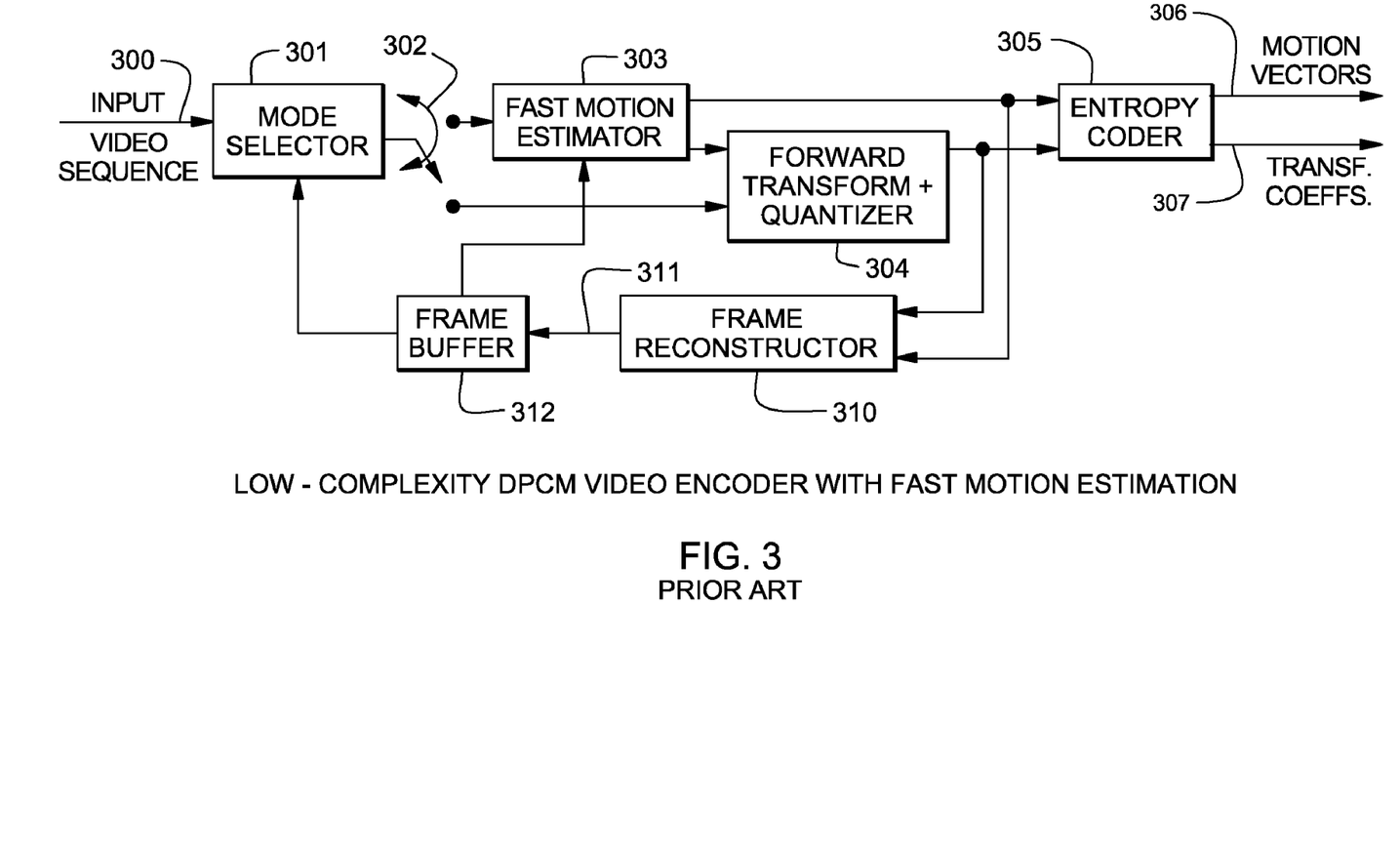
FIG. 3 is a diagram illustrating a prior-art video compression system encoder in which encoding complexity is reduced by employing a fast motion estimation method.

The second class of methods to facilitate low-complexity video encoding seeks to reduce the complexity of motion estimation. This is done by either eliminating motion estimation altogether and only using independent coding (for example, Motion-JPEG), or by simplifying motion estimation by restricting the differential predictor search to a small subset of possible predictors. FIG. 3 shows an exemplary embodiment of this class of methods. A fast motion estimator 303, which has low computational complexity, is used to generate a differential predictor for each block. The remaining modules in the encoder (and decoder) are identical to the modules in FIG. 1. Examples of this class of solutions include the methods described in U.S. Pat. No. 7,177,359 for "Method and apparatus to encode a moving image with fixed computational complexity" and U.S. Patent Application Publication No. US 2005/0232360 A1 for "Motion estimation apparatus and method with optimal computational complexity". The main limitation of these approaches is that using independent coding reduces compression efficiency, typically by a factor of two or more, while partial elimination of motion estimation typically does not reduce the complexity of video encoding to the extent required by applications such as surveillance.

Therefore, a need exists for an improved method for video compression wherein the encoder has low computational complexity and high compression efficiency.

SUMMARY OF THE INVENTION

It is an object of this invention to improve methods and systems for video compression.

Another object of the present invention is to provide a method and system for video compression, wherein the video encoder has low computational complexity and high compression efficiency.

These and other objectives are attained with a method of and system for video encoding and decoding to compress a given input video sequence. The method for encoding includes the steps of converting a source video frame into a space-frequency representation; estimating conditional statistics of at least one vector of space-frequency coefficients; estimating encoding rates based on the said conditional statistics; and applying Slepian-Wolf codes with the said computed encoding rates.

The preferred method for decoding includes the steps of generating a side-information vector of frequency coefficients based on previously decoded source data, encoder statistics, and previous reconstructions of the source frequency vector; and performing Slepian-Wolf decoding of at least one source frequency vector based on the generated side-information, the Slepian-Wolf code bits and the encoder statistics.

The preferred embodiment of the invention provides a video encoder (termed the Wyner-Ziv video encoder), which uses practical codes with performance close to the information theoretic Wyner-Ziv/Slepian-Wolf bounds (referred herein as "Slepian-Wolf" codes) in order to efficiently compress video frames without performing motion estimation. This allows the encoder to compress the current frame with significantly lower computational complexity, without sacrificing compression efficiency. The preferred embodiment of the invention also provides a video decoder, which estimates side-information from previously decoded video frames and uses the estimated side-information in conjunction with the received code bits to reconstruct the source video frame.

The key advantage of the present invention is that it significantly reduces video encoding complexity compared to prior art video coding, while allowing high compression efficiency.

BRIEF DESCRIPTION OF THE DRAWINGS

Preferred embodiments of the present invention will be described below in more detail, with reference to the accompanying drawings.

DETAILED DESCRIPTION OF THE PREFERRED EMBODIMENTS

Embodiments of the present invention disclosed herein are intended to be illustrative only, since numerous modifications and variations of these embodiments will be apparent to those of ordinary skill in the art. In reference to the drawings, like numbers will indicate like parts continuously throughout the views.

Figure 4:
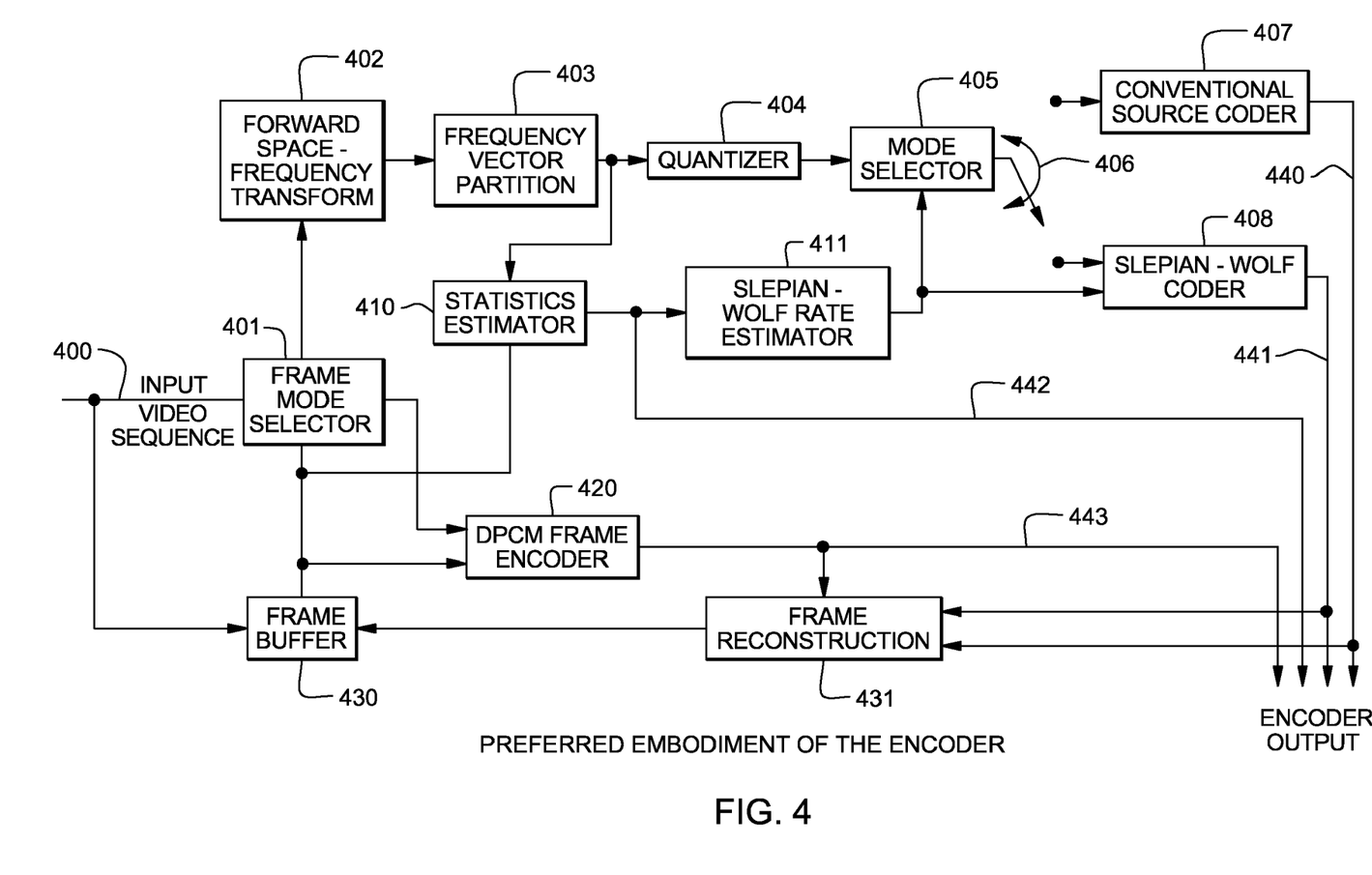
FIG. 4 is a diagram illustrating a method according to an embodiment of the present invention for low-complexity, high compression efficiency encoding.
Figure 5:
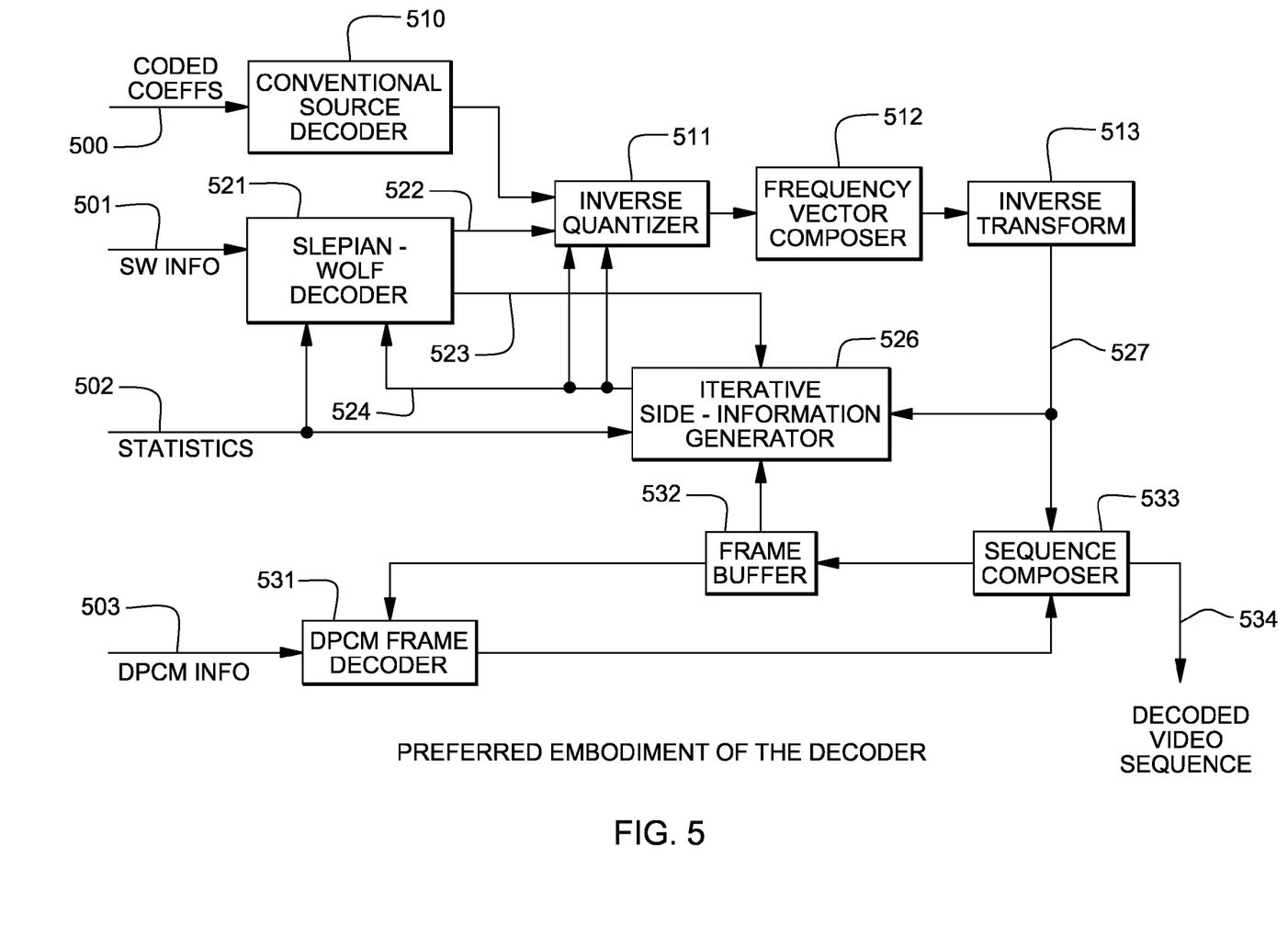
FIG. 5 is a diagram illustrating a method according to an embodiment of the present invention for decoding a compressed representation generated by a low-complexity, high compression efficiency encoder.

FIG. 4 and FIG. 5 depict exemplary embodiments of the preferred embodiments of the present invention. FIG. 4 depicts an exemplary embodiment of a low-complexity, high compression efficiency video encoder. The input to the encoder is the video sequence 400, which is to be compressed. For every video frame in the input video sequence 400, the frame mode selector 401 selects between conventional DPCM frame encoding and between low-complexity Wyner-Ziv encoding. In an exemplary embodiment, the frame mode selector 401 selects DPCM encoding for frames using a fixed temporal period, i.e. it implements the following computation, for a fixed integer n mod(Frame_number, n)==0 ? (encoding_mode=DPCM):(encoding_mode=WZ)

In another exemplary embodiment, the frame mode selector computes the encoding mode by comparing a function of the difference between the current frame and previously encoded frames stored in the frame buffer 430 to a fixed threshold, i.e. it implements the following computation at time t $$\sum_{i,j} \|x_j^t - \alpha_{ij} x_j^{t-i}\| \leq \theta ? (\text{encoding\_mode} = DPCM):(\text{encoding\_mode} = WZ)$$

where θ is a fixed threshold, $\{x^t\}_j$ are the pixels of the video frame current at time t, and $\{\alpha_{ij}\}$ are fixed weights. In an additional exemplary embodiment the weights $\{\alpha_{ij}\}$ and the threshold $\theta$ change with time t.

A video frame selected to be encoded using Wyner-Ziv coding is next input to the forward space-frequency transform means 402. The forward space-frequency transform means 402 applies a space frequency transform to the video frame, yielding as its output a set of transform domain coefficients. In an exemplary embodiment, the space-frequency transform applied by means 402 is comprised of a B×B block transform, for fixed integer B, applied to each B×B block of the input video frame, i.e. the following computation is implemented for the l-th block $$c_{ij}^l = \sum_{m=0}^{B-1}\sum_{k=0}^{B-1} t_{ik} x_{km}^l t_{mj}$$

$$0 \le i < B, 0 \le j < B$$

where $\{x_{ij}^l\}$ are the pixel values of the l-th block, $\{t_{ij}\}$ are fixed real/complex numbers which constitute the space-frequency transform, and $\{c_{ij}^l\}$ are the transform coefficients for the block.

The transform domain coefficients generated by means 402 are input to the frequency vector partition means 403. The frequency vector partition means 403 partitions the set of transform domain coefficients for the current video frame into a plurality of subsets, such that the transform domain coefficients lying in each subset correspond to similar frequencies. In an exemplary embodiment, the frequency vector partition means 403 partitions the set of transform coefficients generated by application of a B×B block transform on a video frame, into $B^2$ vectors such that each vector is comprised of all transform coefficients corresponding to exactly one of the $B^2$ frequencies, i.e. it implements the following computation $$S_m = \{c_{ij}^l : iB+j=m, \forall l\} \quad 0 \le m \le B^2-1$$

where $S_m$ is the m-th frequency vector in the partition. In an additional exemplary embodiment, the frequency vector partition means 403 partitions the set of transform coefficients generated by application of a B×B block transform on a video frame, into less than $B^2$ subsets, such that each vector consists of all transform coefficients corresponding to a set of similar, but not necessarily identical, frequencies.

Each frequency vector generated by frequency vector partition means 403 is input to the statistics estimator 410 and the quantizer 404. The quantizer means 404 discretizes the coefficients constituting the frequency vector. In an exemplary embodiment, the quantizer means 404 uses a uniform scalar quantizer to discretize the coefficients of the frequency vector. In an additional embodiment, the quantizer means 404 uses a uniform scalar quantizer with a deadzone to discretize the coefficients of the frequency vector. In an additional embodiment, the quantizer means 404 uses a vector quantizer to discretize the coefficients of the frequency vector. The statistics estimator 410 estimates the conditional statistics of the frequency vector, conditioned on past frequency vectors, which can be obtained from the frame data stored in the frame buffer 430. In an exemplary embodiment, the statistics estimator 410 models the conditional statistics as a parameterized probability distribution and estimates the parameters of the distribution from the frequency vector and the past frequency vectors. In an additional exemplary embodiment, the statistics estimator 410 models the conditional statistics as a Generalized Gaussian probability distribution, and estimates the variance and shape parameters of the Generalized Gaussian probability distribution using Maximum-Likelihood Estimators given the current and past frequency vectors. In an additional exemplary embodiment, the statistics estimator 410 models the conditional statistics as a Generalized Gaussian probability distribution, and estimates the variance and shape parameters of the Generalized Gaussian probability distribution using low complexity estimators which approximate Maximum-Likelihood Estimators given the current and past frequency vectors.

The output of the statistics estimator 410 are the conditional statistics (parameterized or otherwise) of the current frequency vector conditioned on past frequency vectors. These statistics are input to the Slepian-Wolf rate estimator 411. The Slepian-Wolf rate estimator 411 estimates the rate required to encode the coefficients of the current frequency vector if encoding is to be done using one of a plurality of Slepian-Wolf codes. The encoding rate is, generally, a function of the conditional statistics of the current and past frequency vectors, and of the properties of the plurality of Slepian-Wolf codes used in the encoder. In an exemplary embodiment, the Slepian-Wolf rate estimator 411 uses look-up tables with pre-computed rates required for Slepian-Wolf coding of a frequency vector over a range of conditional statistics. In this embodiment, the Slepian-Wolf rate is estimated as the rate stored in the look-up tables corresponding to the conditional statistics, which are closest to the conditional statistics of the current frequency vector in the sense of the relative entropy. In an additional embodiment, the degree of closeness of conditional statistics is computed by using a low-complexity approximation of the relative entropy. The estimated Slepian-Wolf rate information is input to the mode selector 405 and the Slepian-Wolf coder 408.

The mode selector 405 selects the encoding mode for coefficients belonging to the frequency vector, based on the estimated Slepian-Wolf rate information, on statistics derived from the current frequency vector, and on the conditional statistics derived by the statistics estimator 410. The result is a partition of the frequency vector, with one subset of coefficients coded using Slepian-Wolf coding, while the other subset is coded using a set of conventional source coding modes, wherein each partition is non-fixed in cardinality and location. In an exemplary embodiment, the mode selector 405 selects Slepian-Wolf coding for coefficients with small conditional entropy and high marginal entropy, while other coefficients are encoded using independent coding. In an additional exemplary embodiment, the set of conventional source coding modes is comprised of independent coding, restricted-motion differential coding, and skip coding. The selector 405 is used to input each coefficient to the appropriate coder i.e. the conventional source coder 407 and the Slepian-Wolf coder 408.

The conventional source coder 407 receives frequency vector coefficients, which are to be coded using a conventional source-coding mode, for a plurality of frequency vectors, and receives the corresponding mode information. The output 440 of the source coder 407 is a compressed representation of these coefficients. In an exemplary embodiment, the conventional source coder 407 does skip coding, or independent coding based on the use of entropy coding to compress the discretized frequency coefficients, depending on the mode information. In an additional exemplary embodiment, the conventional source coder 407 uses past frames stored in the frame buffer 430 to additionally perform restricted-motion coding with motion information and prediction error information compressed using entropy coding to generate the compressed representation 440. In an additional embodiment, the conventional source coder uses arithmetic codes to do entropy coding.

The Slepian-Wolf coder 408 receives frequency coefficients, corresponding to one or more frequency vectors, which are to be coded using a Slepian-Wolf code. In addition, the coder 408 receives estimated Slepian-Wolf coding rate information from the estimator 411. The Slepian-Wolf coder selects one of a plurality of Slepian-Wolf codes based on the Slepian-Wolf coding rate information and applies the code to the frequency coefficients; in order to generate the Slepian-Wolf output 441. In an exemplary embodiment, the Slepian-Wolf code is comprised of a matrix whose dimensions are functions of the estimated coding-rate information and the number of frequency coefficients. In this embodiment, the matrix is multiplied with a vector derived from the frequency coefficients in order to generate the Slepian-Wolf information 441. In an additional exemplary embodiment, the matrix is the parity check matrix of an LDPC code. In an additional exemplary embodiment, the matrix is comprised of the concatenation of a plurality of parity check and generator matrices of LDPC codes. In an additional exemplary embodiment, the Slepian-Wolf code is a linear function, which allows for low computational-complexity generation of linear combinations of the discretized frequency coefficients. In an additional exemplary embodiment, the Slepian-Wolf code is comprised of a non-linear function applied to a vector derived from the frequency coefficients to generate the Slepian-Wolf information 441.

A video frame selected to be encoded using conventional DPCM coding is input to the DPCM frame encoder 420. In an exemplary embodiment, the DPCM encoder uses H.264 encoding. The output of the DPCM encoder 420 is the compressed representation of the frame 443. The output of the exemplary embodiment of the improved low-complexity, high compression efficiency video encoder is comprised of information signals 440, 441, 443, and conditional statistical information 442. The information in signals 440, 441, 443 and the frequency coefficients generated by means 402 are input to the frame reconstruction means 431, which constructs an estimate of a subset of the pixels of the decoded video frame. The output of the frame reconstruction means 431 and the original frames of the input video sequence 400 are stored in the frame buffer 430, to be used while encoding future frames.

FIG. 5 depicts an exemplary embodiment of a video decoder, which decodes the compressed representation generated by the low-complexity, high compression efficiency video encoder depicted in FIG. 4. The Slepian-Wolf information 501 is input to the Slepian-Wolf decoder 521. The Slepian-Wolf decoder 521 has additional inputs comprised of a side-information signal 524 and conditional statistical information 502. The outputs of the Slepian Wolf encoder are decoded discretized frequency coefficients 522 and a-posteriori probability distributions 523. In an exemplary embodiment, the Slepian-Wolf decoder 521 performs maximum-likelihood decoding to generate the frequency coefficients 522 based on the side-information 524 and the conditional statistics 502. In this embodiment, the a-posteriori probability signal 523 is generated by computing a-posteriori marginal probabilities of the discretized frequency coefficients based on the side-information 524 and the conditional statistics 502. In an additional embodiment, the Slepian-Wolf decoder 521 uses the belief-propagation algorithm to perform an approximate maximum-likelihood estimate to generate the frequency coefficients 522, and the a-posteriori probabilities 523. In an additional embodiment the Slepian-Wolf decoder 521 uses an approximation to the maximum-likelihood estimate, which is different from the belief propagation algorithm.

The conventionally coded Wyner-Ziv coefficients 500 are decoded using a conventional source decoder 510. The decoded discretized coefficients 525 and the decoded discretized coefficients 522 are input to the inverse quantizer 511 which forms an estimate of the frequency coefficients given the decoded discretized frequency coefficients, the side-information signal 524, and the conditional statistics 502. In an exemplary embodiment, the inverse quantizer 511 forms a minimum-mean squared error (MMSE) estimate on the basis of its inputs to reconstruct each frequency coefficient. In an additional exemplary embodiment, the inverse quantizer 511 forms a minimum absolute error (MAE) estimate on the basis of its inputs to reconstruct each frequency coefficient. In an additional exemplary embodiment the inverse quantizer 511 forms a low computational complexity approximation to the MMSE or MAE estimates on the basis of its inputs. The decoded frequency coefficients are assembled into a frequency domain video frame by the frequency vector composer 512, which is inverse transformed to the pixel domain by the inverse transform means 513.

The output 527 of the inverse transform means 513 is an estimate of the pixel-domain video frame. Due to the nature of Slepian-Wolf decoding, it is possible that this estimate may be erroneous in that certain reconstructed pixels may have large errors compared to the original pixel values. In order to correct these errors, an iterative side-information and Slepian-Wolf decoding algorithm is used. The decoded video frame estimate 527, the conditional statistics 502, the a-posteriori marginal probability information 523 and previously decoded frames stored in the frame buffer 532 are input to the iterative side-information generator 526 which generates a new side-information signal 524. (Note that in the first iteration, signals 527 and 523 are unavailable. In that case, the side-information 524 is generated based on the conditional statistics 502 and previously decoded frames stored in the frame buffer 532.) In an exemplary embodiment, the iterative side-information generator interpolates previously decoded frames obtained from the frame buffer 532, and replaces certain pixel values of the reconstructed frame output from inverse transform means 513 with a weighted combination of the interpolated pixel value and the reconstructed pixel value, wherein the weights are determined by the conditional statistics 502 and the a-posteriori probability information 523. In an additional exemplary embodiment, the interpolated values and replaced values are transform domain coefficient values rather than pixel domain values. The new side-information signal 524 is used in a new iteration of Slepian-Wolf decoding, inverse quantization and inverse transform. The process terminates when the reconstructed pixel-domain video frame output from inverse transform means 513 becomes stable from one iteration to the next. When this occurs, the reconstructed frame output from inverse transform means 513 is input to the sequence composer 533.

The DPCM frame information 503 is input to the DPCM frame decoder 531. In an exemplary embodiment, the DPCM frame decoder uses H.264 decoding. The decoded DPCM frames are input to the sequence composer 533, which outputs the decoded video sequence 534. Additionally, both DPCM and Wyner-Ziv decoded frames are stored in the frame buffer 532 for use in decoding future frames.

It is to be further understood that, because some of the constituent system components and method steps depicted in the accompanying figures may be implemented in software, the actual connections between the system components (or the process steps) may differ depending upon the manner in which the present invention is programmed. Given the teachings of the present invention provided herein, one of ordinary skill in the art will be able to contemplate these and similar implementations or configurations of the present invention.

The method of the present invention will be generally implemented by a computer executing a sequence of program instructions for carrying out the steps of the method and may be embodied in a computer program product comprising media storing the program instructions. For example, FIG. 6 and the following discussion provide a brief general description of a suitable computing environment in which the invention may be implemented. It should be understood, however, that handheld, portable, and other computing devices of all kinds are contemplated for use in connection with the present invention. While a general-purpose computer is described below, this is but one example, the present invention may be implemented in an environment of networked hosted services in which very little or minimal client resources are implicated, e.g., a networked environment in which the client device serves merely as a browser or interface to the World Wide Web.

Although not required, the invention can be implemented via an application-programming interface (API), for use by a developer, and/or included within the network browsing software, which will be described in the general context of computer-executable instructions, such as program modules, being executed by one or more computers, such as client workstations, servers, or other devices. Generally, program modules include routines, programs, objects, components, data structures and the like that perform particular tasks or implement particular abstract data types. Typically, the functionality of the program modules may be combined or distributed as desired in various embodiments. Moreover, those skilled in the art will appreciate that the invention may be practiced with other computer system configurations. Other well known computing systems, environments, and/or configurations that may be suitable for use with the invention include, but are not limited to, personal computers (PCs), server computers, hand-held or laptop devices, multi-processor systems, microprocessor-based systems, programmable consumer electronics, network PCs, minicomputers, mainframe computers, and the like. The invention may also be practiced in distributed computing environments where tasks are performed by remote processing devices that are linked through a communications network or other data transmission medium. In a distributed computing environment, program modules may be located in both local and remote computer storage media including memory storage devices.

Figure 6:
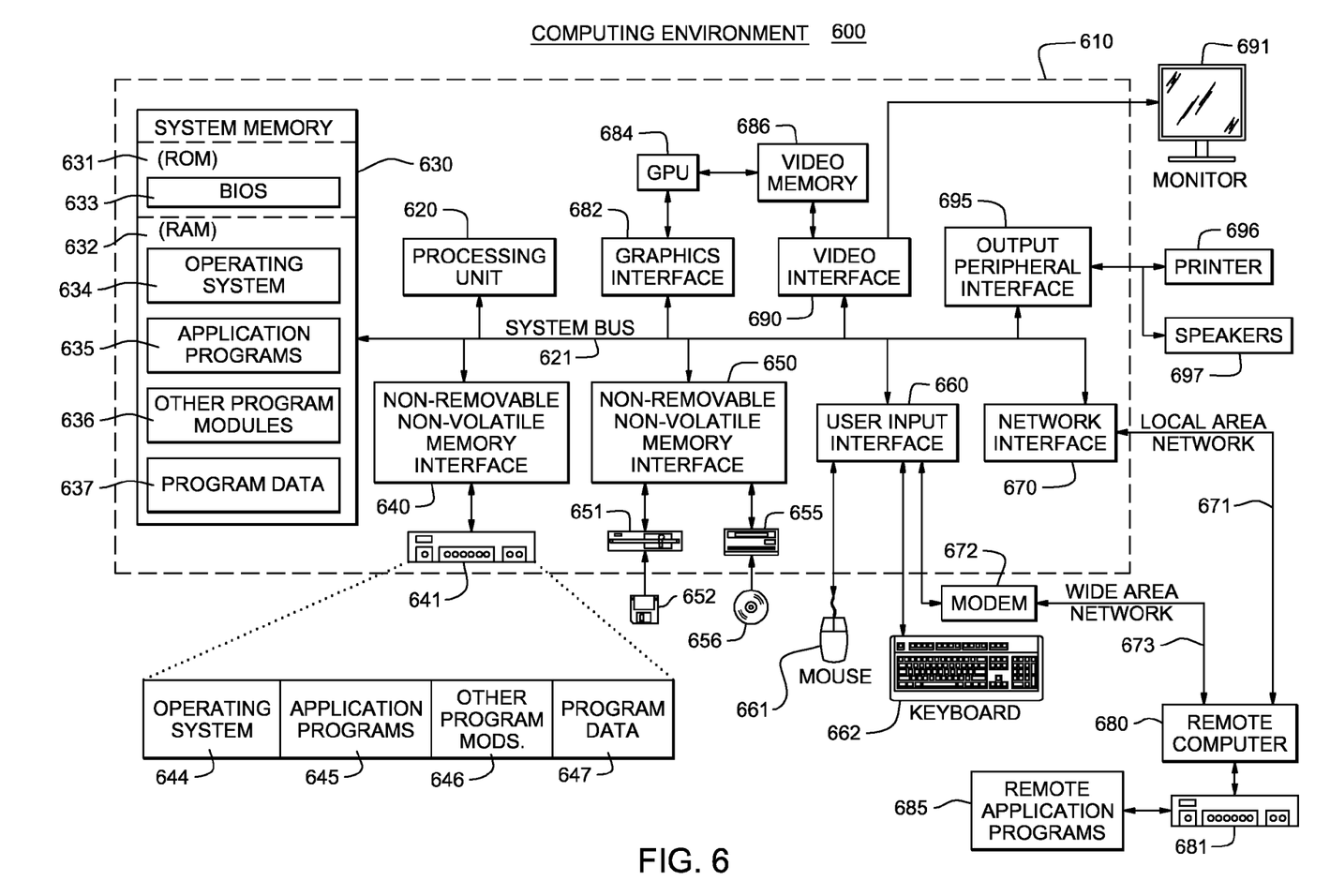
FIG. 6 is a block diagram of an exemplary computing environment in which the invention may be implemented.

FIG. 6, thus, illustrates an example of a suitable computing system environment 600 in which the invention may be implemented, although as made clear above, the computing system environment 600 is only one example of a suitable computing environment and is not intended to suggest any limitation as to the scope of use or functionality of the invention. Neither should the computing environment 600 be interpreted as having any dependency or requirement relating to any one or combination of components illustrated in the exemplary operating environment 600.

With reference to FIG. 6, an exemplary system for implementing the invention includes a general purpose-computing device in the form of a computer 610. Components of computer 610 may include, but are not limited to, a processing unit 620, a system memory 630, and a system bus 621 that couples various system components including the system memory to the processing unit 620. The system bus 621 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus (also known as Mezzanine bus).

Computer 610 typically includes a variety of computer readable media. Computer readable media can be any available media that can be accessed by computer 610 and includes both volatile and nonvolatile media, removable and non-removable media. By way of example, and not limitation, computer readable media may comprise computer storage media and communication media. Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CDROM, digital versatile disks (DVD) or other optical disk storage, magnetic cassettes, magnetic tape, magnetic disk storage or other magnetic storage devices, or any other medium which can be used to store the desired information and which can be accessed by computer 610. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared, and other wireless media. Combinations of any of the above should also be included within the scope of computer readable media.

The system memory 630 includes computer storage media in the form of volatile and/or nonvolatile memory such as read only memory (ROM) 631 and random access memory (RAM) 632. A basic input/output system 633 (BIOS), containing the basic routines that help to transfer information between elements within computer 610, such as during start-up, is typically stored in ROM 631. RAM 632 typically contains data and/or program modules that are immediately accessible to and/or presently being operated on by processing unit 620. By way of example, and not limitation, FIGS. 4-6 illustrate operating system 634, application programs 635, other program modules 636, and program data 637.

The computer 610 may also include other removable/non-removable, volatile/nonvolatile computer storage media. By way of example only, FIGS. 4-6 illustrate a hard disk drive 641 that reads from or writes to non-removable, nonvolatile magnetic media, a magnetic disk drive 651 that reads from or writes to a removable, nonvolatile magnetic disk 652, and an optical disk drive 655 that reads from or writes to a removable, nonvolatile optical disk 656, such as a CD ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The hard disk drive 641 is typically connected to the system bus 621 through a non-removable memory interface such as interface 640, and magnetic disk drive 651 and optical disk drive 655 are typically connected to the system bus 621 by a removable memory interface, such as interface 650.

The drives and their associated computer storage media discussed above and illustrated in FIG. 6 provide storage of computer readable instructions, data structures, program modules and other data for the computer 610. In FIG. 6, for example, hard disk drive 641 is illustrated as storing operating system 644, application programs 645, other program modules 646, and program data 647. Note that these components can either be the same as or different from operating system 634, application programs 635, other program modules 636, and program data 637. Operating system 644, application programs 645, other program modules 646, and program data 647 are given different numbers here to illustrate that, at a minimum, they are different copies. A user may enter commands and information into the computer 610 through input devices such as a keyboard 662 and pointing device 661, commonly referred to as a mouse, trackball or touch pad. Other input devices (not shown) may include a microphone, joystick, game pad, satellite dish, scanner, or the like. These and other input devices are often connected to the processing unit 620 through a user input interface 660 that is coupled to the system bus 621, but may be connected by other interface and bus structures, such as a parallel port, game port or a universal serial bus (USB).

A monitor 691 or other type of display device is also connected to the system bus 621 via an interface, such as a video interface 690. A graphics interface 682, such as Northbridge, may also be connected to the system bus 621. Northbridge is a chipset that communicates with the CPU, or host-processing unit 620, and assumes responsibility for accelerated graphics port (AGP) communications. One or more graphics processing units (GPUs) 684 may communicate with graphics interface 682. In this regard, GPUs 684 generally include on-chip memory storage, such as register storage and GPUs 684 communicate with a video memory 186. GPUs 684, however, are but one example of a coprocessor and thus a variety of co-processing devices may be included in computer 610. A monitor 691 or other type of display device is also connected to the system bus 621 via an interface, such as a video interface 690, which may in turn communicate with video memory 686. In addition to monitor 691, computers may also include other peripheral output devices such as speakers 697 and printer 696, which may be connected through an output peripheral interface 695.

The computer 610 may operate in a networked environment using logical connections to one or more remote computers, such as a remote computer 680. The remote computer 680 may be a personal computer, a server, a router, a network PC, a peer device or other common network node, and typically includes many or all of the elements described above relative to the computer 610, although only a memory storage device 681 has been illustrated in FIG. 6. The logical connections depicted in FIG. 6 include a local area network (LAN) 671 and a wide area network (WAN) 673, but may also include other networks. Such networking environments are commonplace in offices, enterprise-wide computer networks, intranets and the Internet.

When used in a LAN networking environment, the computer 610 is connected to the LAN 671 through a network interface or adapter 670. When used in a WAN networking environment, the computer 610 typically includes a modem 672 or other means for establishing communications over the WAN 673, such as the Internet. The modem 672, which may be internal or external, may be connected to the system bus 621 via the user input interface 660, or other appropriate mechanism. In a networked environment, program modules depicted relative to the computer 610, or portions thereof, may be stored in the remote memory storage device. By way of example, and not limitation, FIG. 6 illustrates remote application programs 685 as residing on memory device 681. It will be appreciated that the network connections shown are exemplary and other means of establishing a communications link between the computers may be used.

One of ordinary skill in the art can appreciate that a computer 610 or other client device can be deployed as part of a computer network. In this regard, the present invention pertains to any computer system having any number of memory or storage units, and any number of applications and processes occurring across any number of storage units or volumes. The present invention may apply to an environment with server computers and client computers deployed in a network environment, having remote or local storage. The present invention may also apply to a standalone computing device, having programming language functionality, interpretation and execution capabilities.

As will be readily apparent to those skilled in the art, the present invention can be realized in hardware, software, or a combination of hardware and software. Any kind of computer/server system(s)—or other apparatus adapted for carrying out the methods described herein—is suited. A typical combination of hardware and software could be a general-purpose computer system with a computer program that, when loaded and executed, carries out the respective methods described herein. Alternatively, a specific use computer, containing specialized hardware for carrying out one or more of the functional tasks of the invention, could be utilized.

The present invention, or aspects of the invention, can also be embodied in a computer program product, which comprises all the respective features enabling the implementation of the methods described herein, and which—when loaded in a computer system—is able to carry out these methods. Computer program, software program, program, or software, in the present context mean any expression, in any language, code or notation, of a set of instructions intended to cause a system having an information processing capability to perform a particular function either directly or after either or both of the following: (a) conversion to another language, code or notation; and/or (b) reproduction in a different material form.

Having described embodiments for a mechanism and method for a video compression system with a low-complexity, high compression efficiency encoder, it is noted that modifications and variations can be made by persons skilled in the art in light of the above teachings. It is therefore to be understood that changes may be made in the particular embodiments of the invention disclosed which are within the scope and spirit of the present invention.

What is claimed is:

1. A method of encoding in a video compression system, the method comprising the steps of:

converting a source video frame into a quantized source space-frequency representation including a set of frequency vectors, each vector including a set of coefficients;

estimating defined conditional statistics of each frequency vector of a subset of said set of frequency vectors;

estimating, for a subset of coefficients from each of said subset of frequency vectors, an encoding rate based on said defined conditional statistics; and applying a Slepian-Wolf code to said each subset of coefficients to encode said each subset of coefficients at the encoding rate estimated for said each subset of coefficients; and wherein the step of estimating the defined conditional statistics includes the step of for each of the frequency vectors of the subset of the set of frequency vectors, identifying another frequency vector having a defined relationship to said each frequency vector, and estimating a conditional probability distribution of the said each vector, conditioned on said other frequency vector.

2. A method according to claim 1, wherein each of the said subset of coefficients has nonfixed cardinality and location.

3. A method according to claim 1, wherein the step of estimating the encoding rates includes the step of estimating the encoding rate based on the properties of a plurality of Slepian-Wolf codes and on the conditional statistics of the current and past frequency vectors.

4. A method according to claim 1, wherein the step of estimating the conditional statistics includes the step of modeling the conditional statistics as a Generalized Gaussian probability distribution, and estimating variance and shape parameters of the Generalized Gaussian probability distribution.

5. A method according to claim 1, wherein the estimated encoding rates are obtained from a look-up table.

6. A method according to claim 1, wherein the applying step includes the step of computing a combination of syndrome and parity bits of a given linear code.

7. A method according to claim 1, wherein selected ones of video frames are encoded using said converting, estimating and applying steps, and the method comprises the further step of encoding other video frames using DPCM encoding.

8. The method according to claim 1, wherein the converting the source video frame into a quantized source space-frequency representation includes:
applying a space-frequency transform to the video frame to yield a set of transform domain coefficients; and
partitioning the set of transform domain coefficients into a plurality of subsets, wherein the transform domain coefficients in each subset correspond to a defined frequency, and each of the transform domain coefficients form one of the frequency vectors.

9. A method of decoding in a video compression system, the method comprising the step of:
receiving from an encoder (i) a vector of code words obtained by applying one or more Slepian-Wolf codes to a plurality of source space-frequency vectors, and (ii) conditional statistics obtained from each of said frequency vectors, said conditional statistics being obtained by identifying, for each of the space frequency vectors, another one of the space-frequency vectors having a defined relationship to said each space-frequency vector, and estimating a conditional probability distribution of the said each space-frequency vector, conditioned on said another one of the space-frequency vectors;
generating defined side-information; and
performing Slepian-Wolf decoding of at least one subset of the code words belonging to the vector of code words based on the generated side-information and said conditional statistics to generate reconstructed frequency coefficients.

10. A method according to claim 9, wherein the step of generating defined side-information includes the step of generating a side-information vector of frequency coefficients based on previously decoded source data, conditional statistics received from the encoder, and previous reconstructions of the source frequency vector.

11. A method according to claim 10, wherein:
said side information vector is additionally based on a-posteriori probability information from the Slepian-Wolf decoder; and
the step of performing Slepian-Wolf decoding to generate reconstructed frequency coefficients is repeated until the change in the reconstructed source frequency vectors, from one generated reconstructed source frequency vector to the next generated reconstructed frequency vector, is below a defined limit.

12. A method according to claim 9, wherein the step of performing Slepian-Wolf decoding includes the step of forming a minimum mean-squared estimate of each of said frequency coefficients on the basis of discretized frequency coefficients, said side-information, and said conditional statistics.

13. A system for compressing video data, comprising:
a converter for converting a source video frame into a quantized source space-frequency vector representation including a set of frequency vectors, each vector including a set of coefficients;
a statistics estimator for estimating defined conditional statistics of each frequency vector of a subset of said set of frequency vectors;
an encoder rate estimator for estimating, for a subset of coefficients from said subset of frequency vectors, an encoding rate based on said defined conditional statistics; and
a Slepian-Wolf coder for applying a Slepian-Wolf code to said each subset of coefficients to encode said each subset of coefficients at the encoding rate estimated for said each subset of coefficients; and wherein
the statistics estimator identifies for each of the frequency vectors of the subset of the set of frequency vectors, another one of the frequency vectors having a defined relationship to said each frequency vector, and estimates a conditional probability distribution of said each frequency vector, conditioned on said another one of the frequency vectors.

14. A system according to claim 13, wherein the encoding rate is estimated based on the properties of a plurality of Slepian-Wolf codes and on the conditional statistics of the current and past frequency vectors.

15. A system according to claim 13, wherein the conditional statistics are estimated by modeling the conditional statistics as a Generalized Gaussian probability distribution, and estimating variance and shape parameters of the Generalized Gaussian probability distribution.

16. A system according to claim 13, further comprising a decoder, said decoder comprising:
a Slepian-Wolf decoder for receiving (i) a vector of code words obtained by applying one or more Slepian-Wolf codes to one or more source space-frequency vectors, and (ii) conditional statistics of said source frequency vector;
a side information generator for generating defined side-information; and
said Slepian-Wolf decoder performing Slepian-Wolf decoding of at least one subset of the code words belonging to the vector of code words based on the generated side-information and said conditional statistics to generate reconstructed frequency coefficients.

17. An article of manufacture for performing encoding in a data compression system, comprising:
at least one tangible computer usable device having computer readable program code logic tangibly embodied therein to execute a machine instruction in a processing unit, said computer readable program code logic when executing performing the following steps:

converting a source video frame into a quantized source space-frequency representation including a set of frequency vectors, each vector including a set of coefficients;

estimating defined conditional statistics of each frequency vector of a subset of said set of frequency vectors;

estimating, for a subset of coefficients from each of said subset of frequency vectors, an encoding rate based on said defined conditional statistics; and applying a Slepian-Wolf code to said each subset of coefficients to encode said each subset of coefficients at the encoding rate estimated for said each subset of coefficients; and wherein the step of estimating the defined conditional statistics includes the step of for each of the frequency vectors of the subset of the set of frequency vectors, identifying another frequency vector having a defined relationship to said each frequency vector, and estimating a conditional probability distribution of the said each vector, conditioned on said other frequency vector.

18. An article of manufacture according to claim 17, wherein each of the subset of coefficients has nonfixed cardinality and location.

\* \* \* \* \*